(12) United States Patent
Winger et al.

(10) Patent No.: US 8,063,541 B2
(45) Date of Patent: Nov. 22, 2011

(54) HOLSTER-INTEGRATED PIEZOELECTRIC ENERGY SOURCE FOR HANDHELD ELECTRONIC DEVICE

(75) Inventors: Lyall Kenneth Winger, Waterloo (CA); Raymond Michael Dikun, Waterloo (CA); Martin George Albert Guthrie, Waterloo (CA); Rene Pierre Marchand, Waterloo (CA); David Gerard Rich, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 85 days.

(21) Appl. No.: 12/606,542

(22) Filed: Oct. 27, 2009

(65) Prior Publication Data

US 2011/0095652 A1    Apr. 28, 2011

(51) Int. Cl.
*H01L 41/113* (2006.01)
*H01L 41/053* (2006.01)

(52) U.S. Cl. .................................. 310/339; 310/348
(58) Field of Classification Search .............. 310/339, 310/348
See application file for complete search history.

(56) References Cited

U.S. PATENT DOCUMENTS

| 6,972,543 | B1 | 12/2005 | Wells |
| 2003/0106917 | A1 | 6/2003 | Shetler et al. |
| 2004/0189246 | A1 | 9/2004 | Bulai et al. |
| 2005/0134149 | A1* | 6/2005 | Deng et al. ............... 310/339 |
| 2005/0280334 | A1 | 12/2005 | Ott et al. |
| 2007/0257634 | A1 | 11/2007 | Leschin et al. |
| 2007/0279002 | A1 | 12/2007 | Partovi |
| 2008/0074002 | A1 | 3/2008 | Priya et al. |
| 2008/0246439 | A1* | 10/2008 | Tsui et al. ............... 320/137 |

FOREIGN PATENT DOCUMENTS

| GB | 2389719 | 12/2003 |
| WO | 01/35470 A1 | 5/2001 |

OTHER PUBLICATIONS

Anton et al., "A review of power harvesting using piezoelectric materials (2003-2006)", IOP Publishing, Smart Materials and Structures, vol. 16, No. 3, Jun. 2007, pp. R1-R21.
Navas et al., "Miniaturised battery charger using piezoelectric transformers", Applied Power Electronics Conference and Exposition, vol. 1, Mar. 2001, pp. 492-496.
Liu et al., "Velocity-Controlled Piezoelectric Switching Energy Harvesting Device", International Conference on Renewable Energies and Power Quality, Valencia (Spain), Apr. 15-17, 2009, pp. 1-5.
Frederick, "Analysis and Fabrication of MEMS Tunable Piezoelectric Resonators", University of Pittsburgh, School of Engineering, May 5, 2006, pp. 1-141.
European Patent Application No. 09174253.6, Search Report dated Mar. 10, 2010.

* cited by examiner

*Primary Examiner* — Derek Rosenau
(74) *Attorney, Agent, or Firm* — Louis B. Allard; Borden Ladner Gervais LLP

(57) ABSTRACT

A holster for a handheld electronic device. The holster has integrated therein one or more piezoelectric elements that provide an output voltage to the handheld electronic device upon insertion of device in the holster. The output voltage can be used to charge the battery of the device, to power, at least in part, the device, or both. The output voltage is generated by harvesting vibration energy at the piezoelectric elements upon the holster being subjected to acceleration caused by a user carrying the holster when walking, running, or during any other suitable activity.

8 Claims, 11 Drawing Sheets

US 8,063,541 B2

HOLSTER-INTEGRATED PIEZOELECTRIC ENERGY SOURCE FOR HANDHELD ELECTRONIC DEVICE

FIELD OF THE DISCLOSURE

The present disclosure relates generally to energy sources for handheld electronic device. More particularly, the present disclosure relates to holster-integrated energy sources for handheld electronic devices.

BACKGROUND OF THE DISCLOSURE

Handheld electronic devices (HEDs) are typically equipped with a battery that requires recharging at regular intervals in order for the HED to remain functional. Although advances in battery technology have provided longer time periods between recharging the batteries, recharging is still required and can be inconvenient.

Some HEDs can include built-in piezoelectric energy sources; however the integration of piezoelectric members and circuitry into an HED can increase the dimensions of the HED, which goes against the trend of miniaturization of such devices.

Other approaches to using piezoelectric energy sources with HEDs include having a piezoelectric charge module that can be removably secured to an HED while the HED is not in use. This makes for a bulky HED/piezoelectric arrangement.

BRIEF DESCRIPTION OF THE DRAWINGS

Embodiments of the present disclosure will now be described, by way of example only, with reference to the attached Figures, wherein.

DETAILED DESCRIPTION

Figure 1:
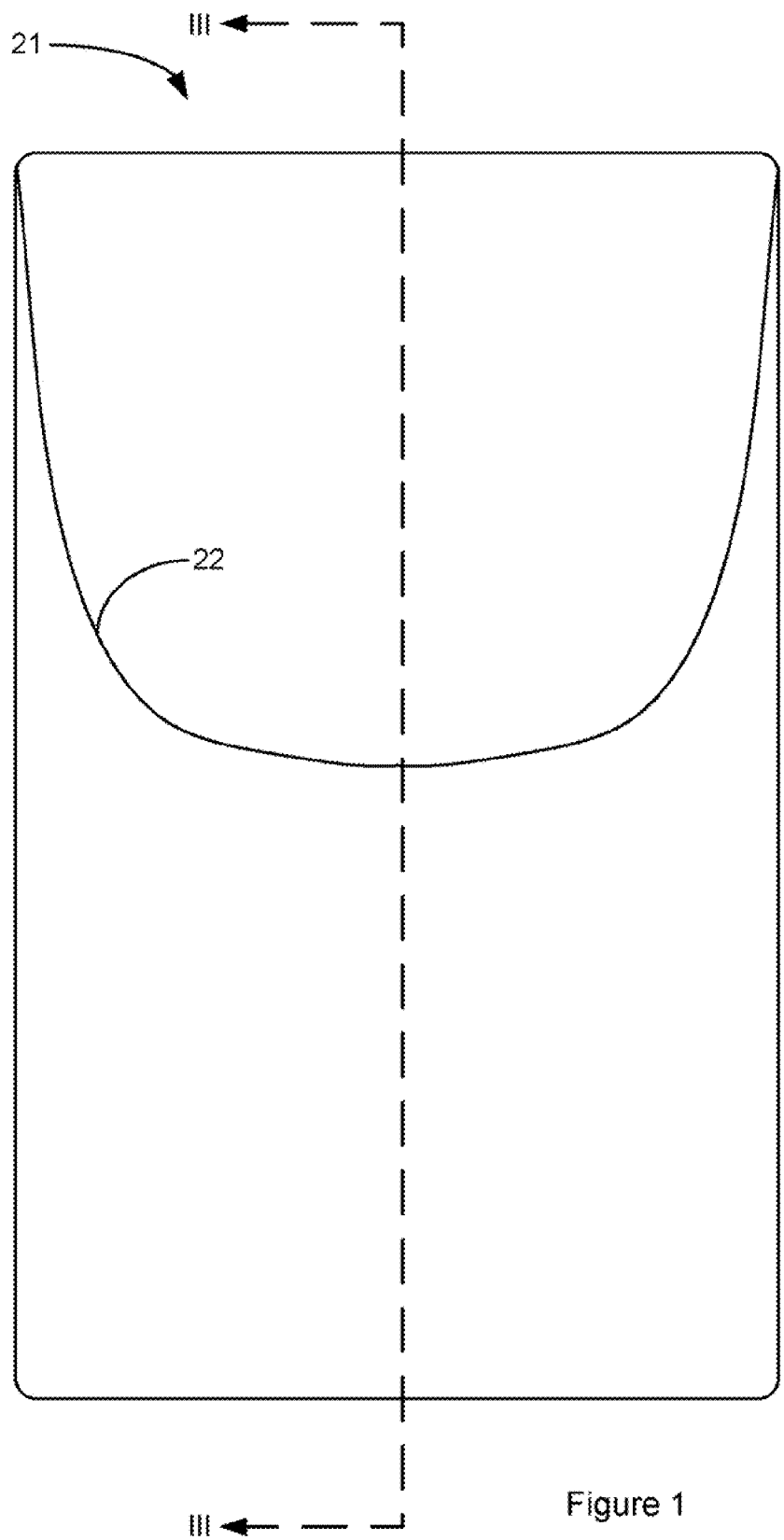
FIG. 1 shows a front view of an exemplary embodiment of the holster of the present disclosure.

The following disclosure is generally directed to holster for a handheld electronic device, into which the HED can be inserted and withdrawn by a user. The holster is typically configured to retain the HED when the user inserts the HED into the holster, and is further configured to make the HED readily accessible for withdrawal by the user. For purposes of illustration, the HED is equipped with a rechargeable battery. The holster includes one or more piezoelectric elements that generate an input voltage, and further includes charging circuitry. The charging circuitry includes an electrical connector that is configured to electrically couple to the HED when the HED is inserted into the holster. As will be described below, the holster is configured to charge the rechargeable battery of the HED when the HED is inserted in the holster.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limited to the scope of the embodiments described herein.

Generally, the present disclosure provides a holster for a HED, the holster has integrated therein one or more piezoelectric elements and charging circuitry that can provide useful output voltage and current to the HED upon the HED being inserted in the holster to electrically connect the HED to the charging circuitry. The electrical connection is typically by way of a mating connector that electrically couples the HED to the charging circuitry. The concepts described herein are not limited to any particular kind of electrical connection or connector, and can include, for example, tab-terminal-to-tab-terminal connections, plug-to-socket connections and spring-loaded-prong-to-blade connections. The output voltage and current can be used to charge the battery, to power the HED, at least in part, or both. (The concepts of power, energy, voltage and current are related to one another. In the discussion below, the concepts will typically be discussed in terms of voltages and currents.) The output voltage is generated by harvesting vibration energy at the piezoelectric elements upon the holster being subjected to acceleration caused by a user carrying the holster when walking, running, or during any other suitable activity. The acceleration causes the piezoelectric elements to deform, which generates the voltage in question. As will be understood by the skilled worker, the present disclosure is also applicable to portable docking stations for HEDs.

The HED can also be referred to as portable electronic device or a mobile electronic device and, it may be a two-way communication device with advanced data communication capabilities including the capability to communicate with other portable electronic devices or computer systems through a network of transceiver stations. The HED may also have the capability to allow voice communication. Depending on the functionality provided by the portable electronic device, it may be referred to as a data messaging device, a two-way pager, a cellular telephone with data messaging capabilities, a wireless Internet appliance, a personal area network device (e.g., Bluetooth™ devices) or a data communication device (with or without telephony capabilities). The portable electronic device may also be a portable device without wireless communication capabilities as a handheld electronic game device, digital photograph album, digital camera and the like.

In a first aspect, the present disclosure provides a holster for a handheld electronic device. The holster comprises: at least one piezoelectric element to generate an input voltage upon being deformed; and charging circuitry electrically connected to the at least one piezoelectric element. The charging circuitry has an electrical connector. The charging circuitry is to provide an output voltage to the electrical connector in accordance with the input voltage and in accordance with pre-determined charging circuit parameters. The electrical connector is to connect to the handheld electronic device upon the electronic device being inserted into the holster, to provide the output voltage to the handheld device.

The holster can comprise a chamber for housing the at least one piezoelectric element. Each piezoelectric element can have a first portion fixedly secured to the chamber and a second portion movable with respect to the first portion. Each piezoelectric can be an elongated member. The holster can define a cavity having a cavity length along which the handheld electronic device can be slid in and out of the holster. Each elongated member can be substantially parallel to the cavity length. Each elongated member can be substantially perpendicular to the cavity length. The holster can define a housing for receiving the handheld electronic device, the holster can further comprise a fastening element secured to the housing, the fastening element being rotatable with respect to the housing to change an orientation of the housing with respect to the fastening element. The fastening element can includes a clip.

In a second aspect, the present disclosure provides a holster in combination with a handheld electronic device.

In a third aspect, the present disclosure provides a holster for a handheld electronic device. The holster comprises: at least one piezoelectric element to generate an input voltage upon being deformed; charging circuitry electrically connected to the at least one piezoelectric element; and a coil electrically connected to the charging circuitry. The charging circuitry is to provide an output voltage to the coil in accordance with the input voltage and in accordance with pre-determined charging circuit parameters. The coil is to inductively couple the charging circuitry to the handheld electronic device upon the handheld electronic device being inserted into the holster. The charging circuitry and the coil can define an assembly that has an assembly resonant frequency; and the at least one piezoelectric element can have a piezoelectric element resonant frequency. The assembly resonant frequency can be substantially equal to the piezoelectric element resonant frequency. The charging circuitry can include at least one capacitor.

Figure 2:
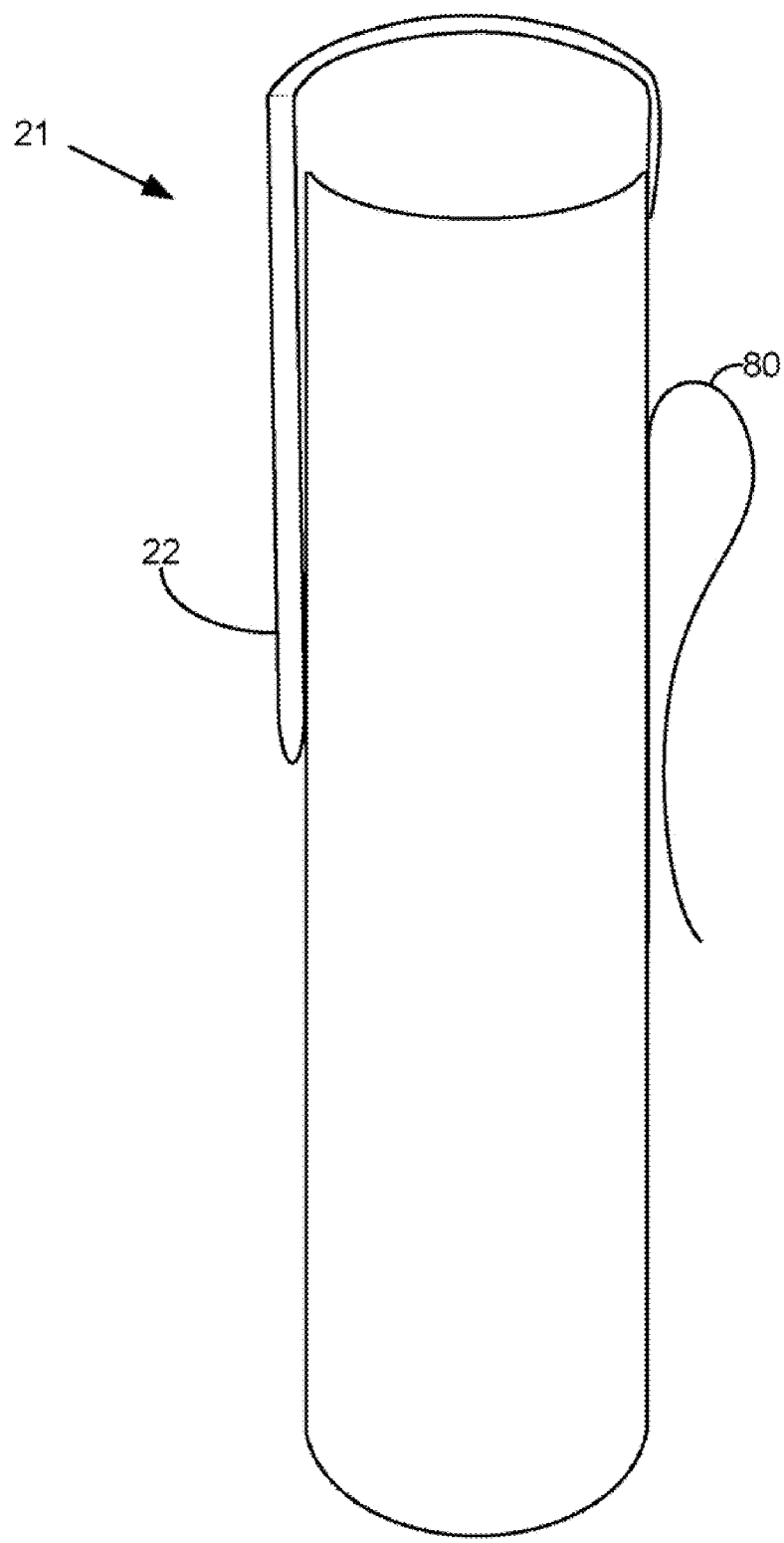
FIG. 2 shows a side view of the holster of FIG. 1.

FIG. 1 shows a front view of an exemplary embodiment of a holster 21 of the present disclosure. FIG. 2 shows a side view of the holster 21. The holster 21 can be used for any suitable handheld electronic device (HED) that runs on electricity, which is typically provided by a battery or by any other suitable electrical charge storage device such as, for example, a capacitor. A flexible holster cover 22 is also shown at FIGS. 1 and 2, and serves to hold and secure the HED in the holster 21. The holster 21 can have and exterior portion made of any suitable material (having any desirable aesthetic, electrical, durability, strength, or other characteristics or combinations of characteristics) such as, e.g., leather, nylon, etc. The holster cover 22 can be held closed through any suitable means such as, for example, a magnetic closure, a hook and loop closer, a snap-fit closure, etc. As will be understood by the skilled worker, holsters not having a cover are also within the scope of the present invention. A clip 80, shown at FIG. 2, allows a user to secure the holster 21 to a belt, purse, pocket etc. As will be further be understood by the skilled worker, any other suitable fastening element such as, e.g., a loop for connecting to a belt can be used. Additionally, the holster of the present disclosure can also function without any fastening element. When present, the fastening element, in the present example, the clip 80, can be rotatable with respect to the housing 82 of the holster, and to the user to which it is fastened, to permit a change in the orientation of housing with respect to the user. This variable orientation of the housing can allow the user to set the orientation in order to adjust the amount of vibration energy being harvested.

Figure 3:
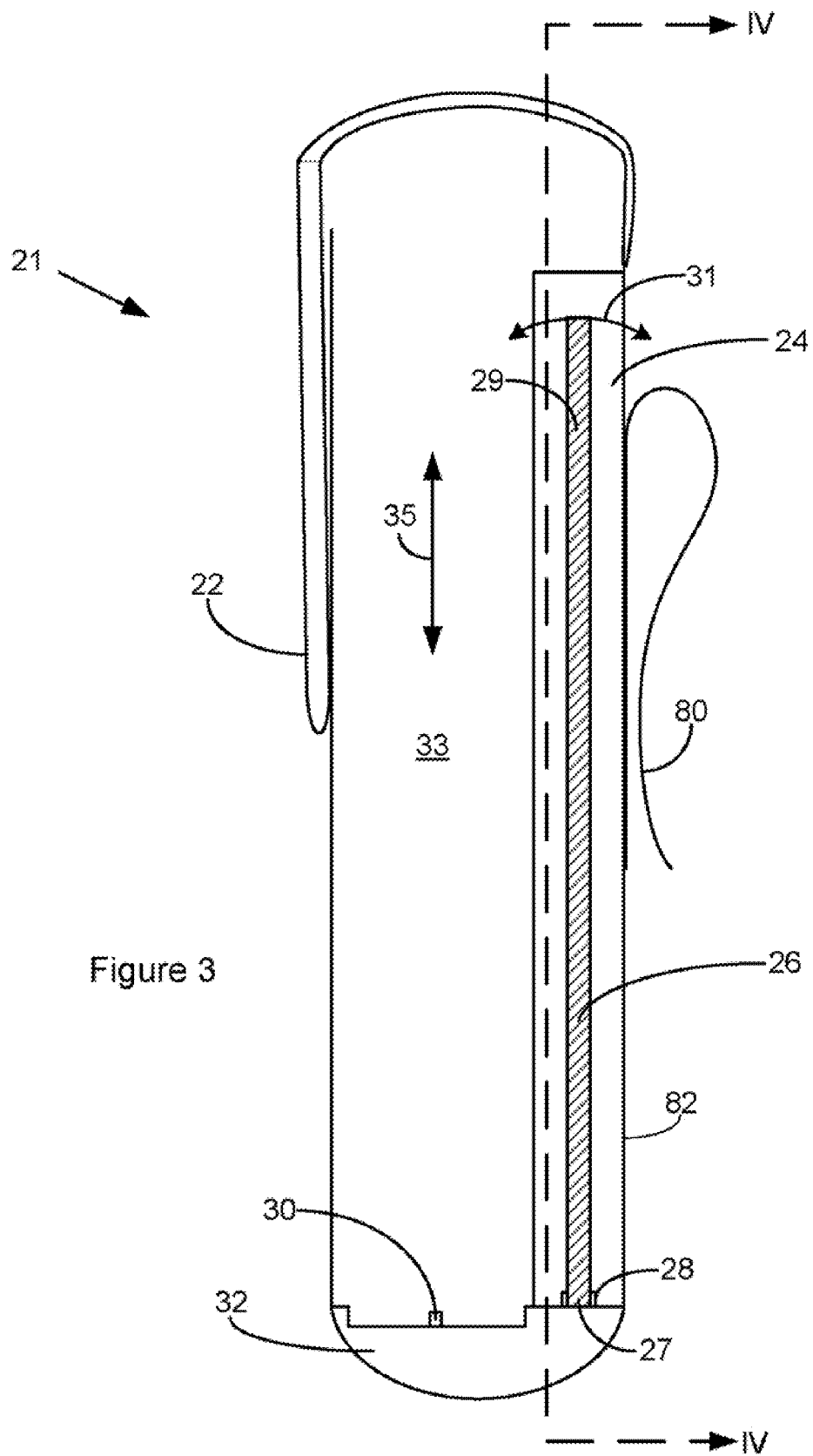
FIG. 3 shows a side cross-sectional view of the holster of FIG. 1.

FIG. 3 shows a side cross-sectional view of the holster 21 taken along III-III of FIG. 1. As shown at FIG. 3, the holster 21 defines a cavity 33 along the length of which, the length direction being indicated by arrow 35, a HED can be slid in and out of the holster. FIG. 3 also shows a chamber 24 that houses one or more piezoelectric element 26, each of which is fixedly secured at a first portion 27 to the chamber 24 by a holder 28, which can be any suitable type of clamp or holding device. Alternatively, any other suitable means to secure the first portion 27 to the chamber 24 can be used such as, e.g., adhesives, press-fits, snap fits, fasteners, etc. Each piezoelectric element 26 has a second portion 29, which movable with respect to the first portion 27 and to the chamber 24, upon the holster being accelerated in any suitable direction. As shown at FIG. 3, and at FIG. 4 described below, the piezoelectric element 26 is substantially parallel to the length of the cavity 33.

Figure 4:
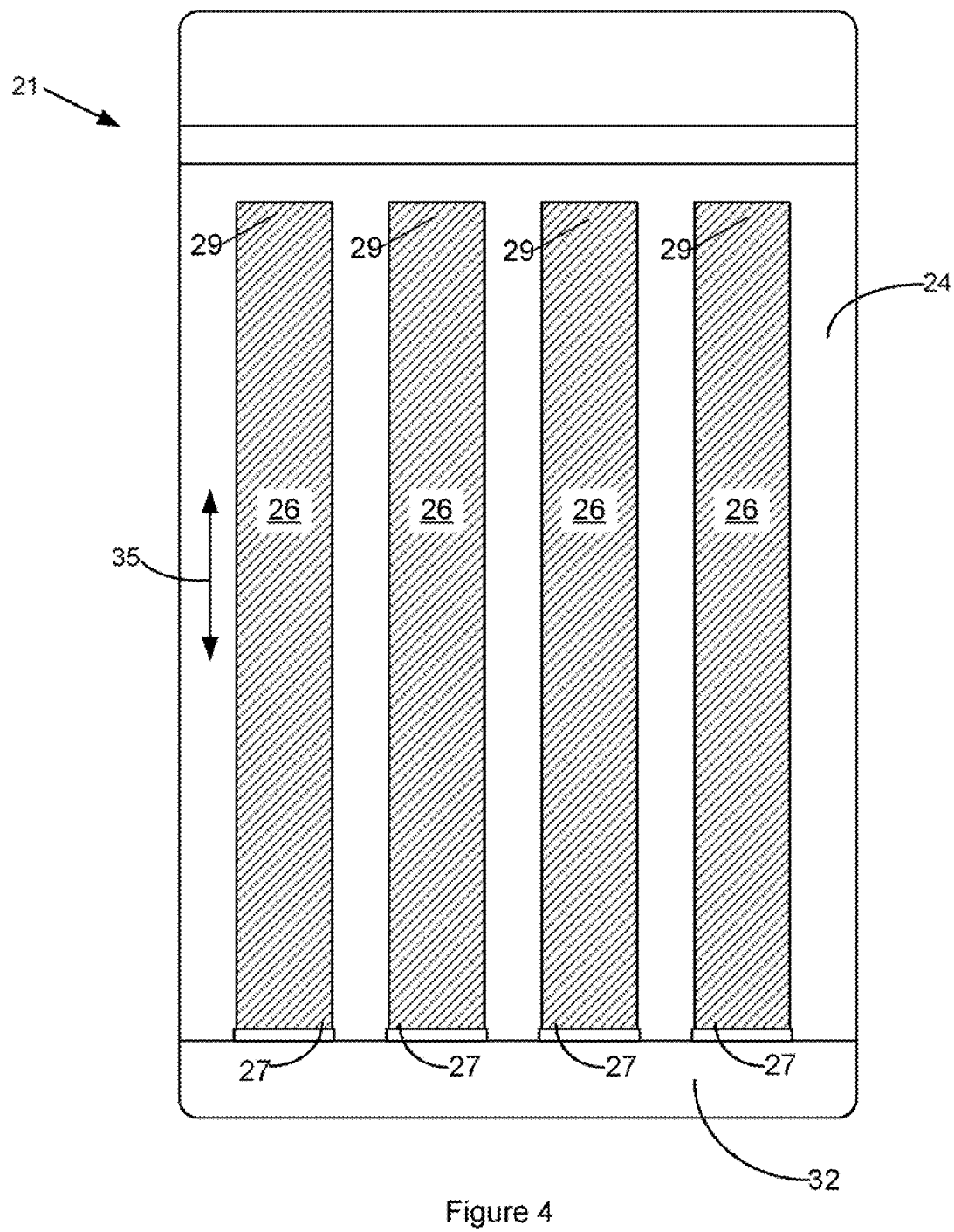
FIG. 4 shows a front cross-sectional view of the holster of FIG. 1.

FIG. 4 shows a front cross-sectional view of the holster 21 taken along line IV-IV of FIG. 3. As shown at FIG. 4, four piezoelectric elements 26 are contained in the chamber 24. However, any suitable number of piezoelectric elements 26 can be used, including one piezoelectric element 26, without departing from the scope of the present disclosure. If more than one piezoelectric elements 26 are present, they can be electrically connected to each other in parallel or in series, or in any suitable parallel/series configuration. The exemplary piezoelectric elements 26 are rectangular-shaped plates; however, this need not the case. Any suitably-shape piezoelectric elements can be used without departing from the scope of the present disclosure. For example, amongst others, disc-shaped, tube-shaped, and ring-shaped piezoelectric elements can also be used. The piezoelectric elements 26 can have any suitable dimensions. For example, the thickness can range from less than a tenth of a millimeter to several millimeters; and, the length and width can range from one to several millimeters. As will be understood by the skilled worker, the dimensions of the piezoelectric elements can be determined in accordance with, amongst other factors: (a) the choice of the piezoelectric material of the piezoelectric elements 26; (b) the required voltage/current characteristics of the HED; and (c) the principal frequencies to which the holster 21 is subjected during the activity practiced by the user, at which energy harvesting is achieved. The concepts described herein are not necessarily limited to any particular number of piezoelectric elements 26, or to any particular electrical connection of piezoelectric elements, or to any particular shape or dimension of piezoelectric elements, or to any combination thereof.

As will be understood by the skilled worker, piezoelectric materials can generate a voltage upon being subjected to deformation, such deformations including, for example, bending, twisting, compression, elongation, etc. The piezoelectric elements 26 are fabricated to undergo such deformations upon the holster being subjected to accelerations such as those encountered when the holster is with a person walking or otherwise moving about. Such deformations will also typically occur when the user is travelling, e.g., on a plane or car; or when the holster 21 sits atop a vibrating object such as a refrigerator or an air conditioning unit.

Upon the holster 21 being subjected to an acceleration, the portion of the piezoelectric element 26 that is not fixedly secured in the holder 28 (the first portion 27), can move with respect to the portion held in the holder 28. The resulting deformation of the piezoelectric element 26 generates a voltage at surfaces of the piezoelectric material comprised in the piezoelectric element 26. A double-arrowed arc 31 at FIG. 3 shows an exemplary movement that the second portion 29 can undergo upon the piezoelectric member 26 being accelerated.

Each piezoelectric element 26 is electrically connected to charging circuitry 32 disposed at the bottom region of the holster 21, as shown at FIGS. 3 and 4. Alternatively, the charging circuitry 32 can be located at any other suitable region of the holster 21 without departing from the scope of the present disclosure. In some cases, charging circuitry could be integrated in the HED itself without departing from the scope of the present disclosure. The connection of each piezoelectric element 26 to the charging circuitry is typically done though a pair of conductors (not shown), with a first conductor connecting the charging circuitry 32 to a first surface of the piezoelectric material of the piezoelectric element 26, and a second conductor connecting the charging circuitry 32 to a second surface of the piezoelectric material of the piezoelectric element 26. The above-noted first and second surfaces of the piezoelectric material can be any surfaces across which a voltage is generated upon the piezoelectric element 26, and the piezoelectric material itself, being deformed. The connection of the surfaces in question to their respective conductor can be achieved through any suitable electrode, defining any suitable pattern, formed on the surfaces.

The deformation of the piezoelectric elements 26 generates an input voltage that is provided to the charging circuitry 32. The charging circuitry 32 has an electrical connector 30 that connects to the HED upon the HED being inserted in the holster 21. Any suitable type of electrical connector can be used, such as, for example, a mini-USB connector, provided the HED includes a complementary connector to mate therewith. The charging circuitry 32 provides an output voltage to the HED in accordance with the input voltage and with pre-determined charging circuit parameters. As used herein, two elements are "in accordance with" one another when the value of one element corresponds to the value of another. For example, two elements may be 'in accordance with" one another when one is a function of the other, or when both vary in response to common factor. A charging circuit parameter is "pre-determined" in the sense that at least one aspect of the parameter is defined prior to charging. Such charging circuit parameters can include, for example, target output voltage and target output current. Any suitable type of charging circuitry can be used. The inputs to the design can include many factors such as, for example, input frequency, resonant frequency, frequency ranges, output voltage and currents etc., and the tradeoffs between these factors. Examples of such circuitry can be found in, amongst other references, the article by Y.-P. Liu et al. entitled *Velocity-Controlled Piezoelectric Switching Energy Harvesting Device, proceedings of International Conference on Renewable Energy and Power Quality*, Valencia, Spain, 15-17 Apr. 2009.

Alternatively, the charging circuitry and the HED can include inductive charging circuitry components to allow inductive charging of the HED by the piezoelectric elements. In such cases, as will be understood by the skilled worker, the connector 30 is not required. Rather, as will be described below, an induction coil can be used instead.

Figure 5A:
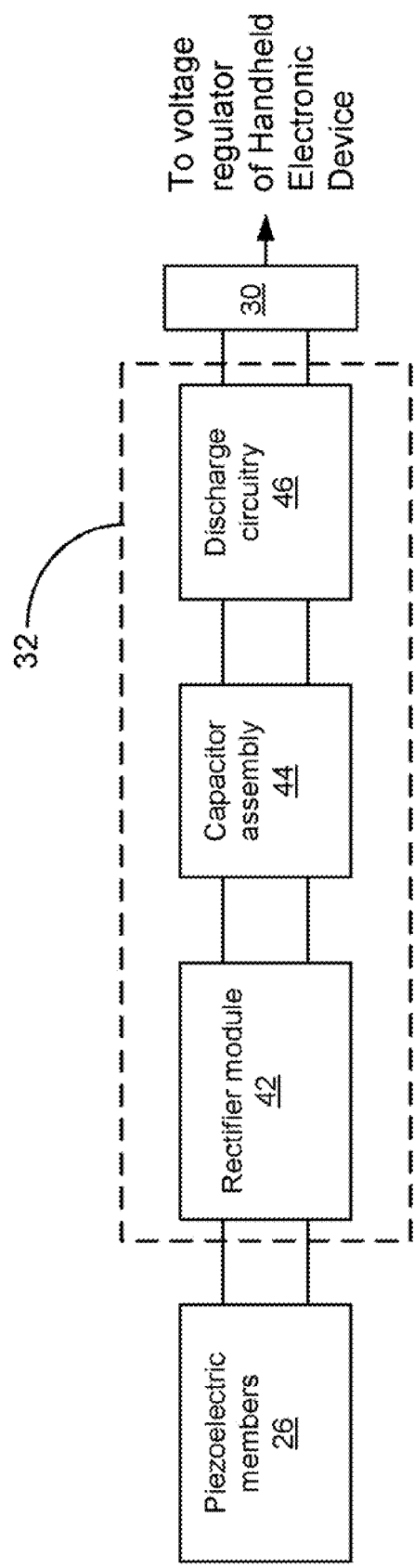
FIG. 5A shows a block diagram depiction of an exemplary charging circuit.

FIG. 5A shows a block diagram of an exemplary charging circuitry 32 electrically connected to the piezoelectric members 26. The charging circuitry 32 can include, as shown in the present exemplary embodiment, a rectifier module 42, a capacitor assembly 44 and discharge circuitry 46. The piezoelectric members 26 provide a time-varying input voltage (this voltage being output from the piezoelectric members 26 but being input to the charging circuitry 32) that is input into the rectifier module 42. In turn, the rectifier module 42 provides a rectified voltage to the capacitor assembly 42, which can include one or more capacitors that are charged by the rectified voltage. The capacitor assembly 42 stores at least some of the energy harvested from the piezoelectric members 26. This storage of energy can occur whether the HED is inserted in the holster or not. The discharge circuitry 46, in accordance with pre-determined parameters, causes the capacitors of the capacitor assembly 44 to discharge and provides an output voltage to an HED electrically connected to the connector 30. This output voltage is fed to a voltage regulator of the HED and can serve to power the HED while inserted in the holster 21, to charge the battery of the HED, or both. The output voltage provided to the electrical connector 30 is in accordance with the input voltage generated by the piezoelectric members 26 in that the output voltage is a function of the input voltage. The connector 30 can be referred to as a coupling element that electrically connects the charging circuitry 32 to the HED. Alternatively, the connector 30 can also be referred to as an electrical transfer means that is electrically connected the charging circuitry 32 to the HED.

Figure 5B:
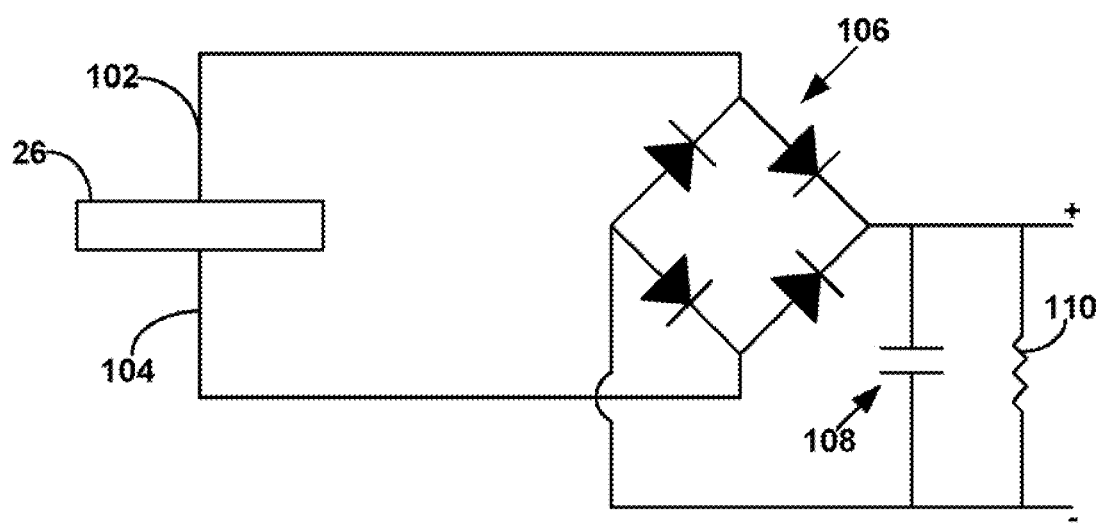
FIG. 5B shows another exemplary charging circuit.

FIG. 5B shows an exemplary charging circuitry having a full wave rectifier 106 electrically connected to a piezoelectric member 26 through connectors 102 and 104. A capacitor 108 and a resistor 110, connected in parallel to the rectifier 106 provide and output voltage to a HED (not shown).

Figure 5C:
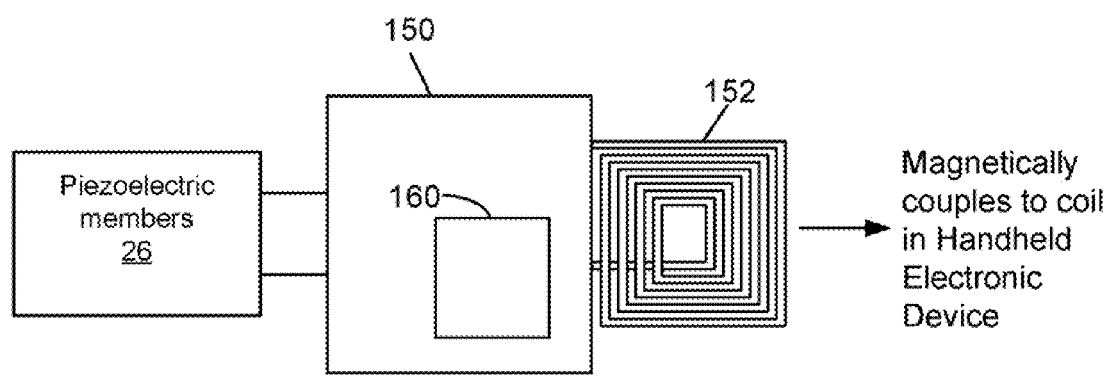
FIG. 5C shows yet another exemplary charging circuit.

FIG. 5C shows a block diagram of another exemplary charging circuitry 150 used to magnetically couple energy harvested by the piezoelectric members 26 to the HED. The charging circuitry 150 is electrically connected to the piezoelectric members 26, which act as an AC source. The charging circuitry 150 can include capacitors, shown as capacitor circuitry 160, electrically connected to a charge coil 152, which is typically made of an electrically conductive material. As will be understood by the skilled worker, a magnetic core can be placed adjacent the charge coil 152 to vary the degree of magnetic coupling to the HED. The characteristics of the charge coil 152 and of the charging circuitry 150 can be chosen such that the assembly formed by the charge coil 152 and the charging circuitry 150 has a resonance frequency substantially equal to that of the piezoelectric members 26. As will be understood by the skilled worker, a HED to be charged by the piezoelectric members/charging circuitry/coil assembly shown in the example of FIG. 5C, needs to include its own magnetic inductive coupling assembly, which can include, for example, a coil and a magnetic core, operatively connected to battery of the HED. The charge coil 152 can be referred to simply as a coil or as a magnetic induction coupling element that inductively couples the charging circuitry 150 to the HED upon the HED being inserted into the holster. The charge coil 152 can also be referred to as a near filed charge coil. The charge coil can have any suitable shape such as, for example square, round, elliptical shapes, and include any number of turns. Alternatively, the charge coil 152 can be referred to as an electrical transfer means that is electrically connected to the charging circuitry 152.

The holster of present disclosure can itself include a rechargeable battery that can be recharged upon the holster, and its piezoelectric elements, being subjected to vibrations. In such embodiments, the HED recharges its own battery from the holster's battery upon the HED being inserted into the holster. As such, a user carrying the holster will recharge the holster's battery even when the HED is out of the holster.

The piezoelectric element 26 can include a laminar arrangement of a substrate and one or more piezoelectric layers. The substrate can be made of any suitable material such as, e.g., aluminum, steel, silicon nitride, etc., and the piezoelectric material can include any suitable material such as, e.g., lead zirconate titanate (PZT). The piezoelectric material can be formed on the substrate by slurry deposition or by any other suitable methods. Alternatively, the piezoelectric element 26 can be produced without a substrate. The piezoelectric element 26 can include a plurality of piezoelectric layers. Each of these piezoelectric layers can be substantially similar to the others, therefore having similar mechanical and electrical properties. Alternatively, each layer can be different from some of the others in terms of, for example, composition, and thickness, therefore having different mechanical and electrical properties. In such a case, a first piezoelectric layer could have a frequency response different than that of another different piezoelectric layer, allowing for the harvest of vibration energy at different frequencies.

Although the piezoelectric elements 26 of the embodiment of the holster 21 are elongated members fixedly secured to chamber 24 at their first end 27 in a cantilever arrangement, any other suitable arrangement and shape of piezoelectric elements can be used without departing from the scope of the present disclosure. For example, elongated piezoelectric beams fixedly secured to the chamber 24 at their opposite ends, with their mid-sections undergoing movement, and deformation, upon the holster being accelerated, are also within the scope of the present disclosure. As a further example, disc-shaped piezoelectric elements having their perimeter portion secured to the chamber 24 and their centre portion moving undergoing movement, and deformation, upon the holster being accelerated, are also within the scope of the present disclosure. Additionally, as will be understood by the skilled worker, the piezoelectric voltage characteristics can be adjusted by fixing a weight to a portion of the piezoelectric element undergoing movement without departing from the scope of the present disclosure.

Figure 6:
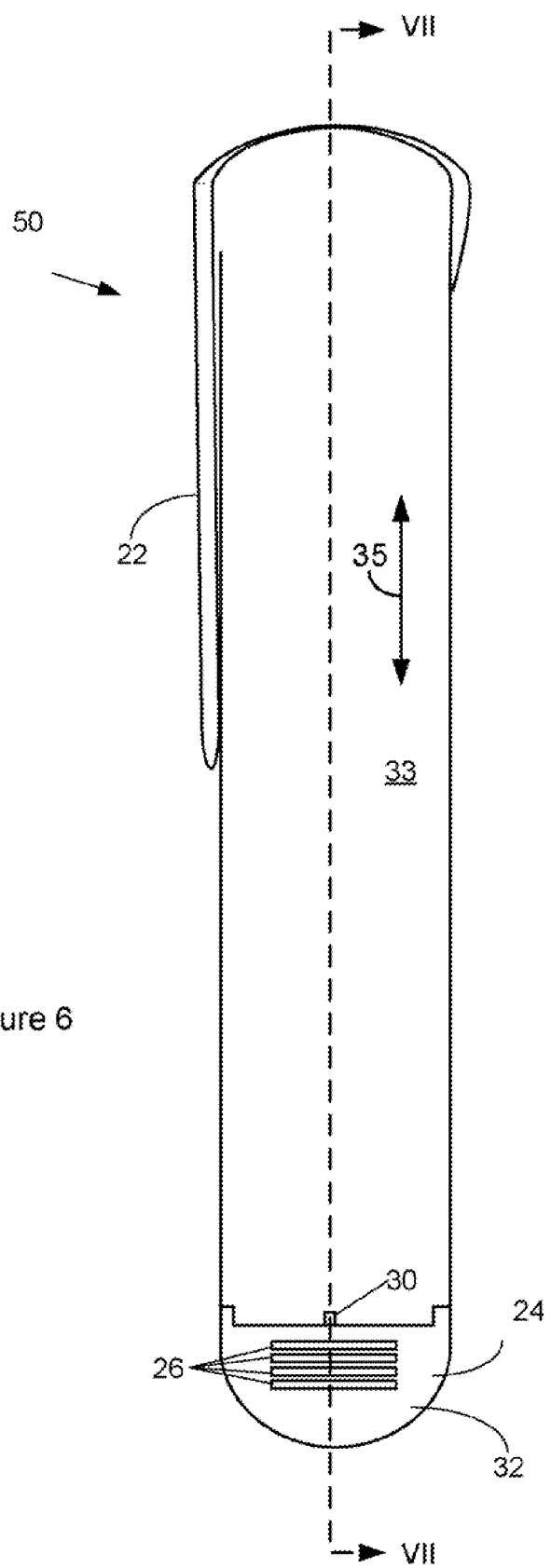
FIG. 6 shows a side cross-sectional view of another exemplary embodiment of the present disclosure.
Figure 7:
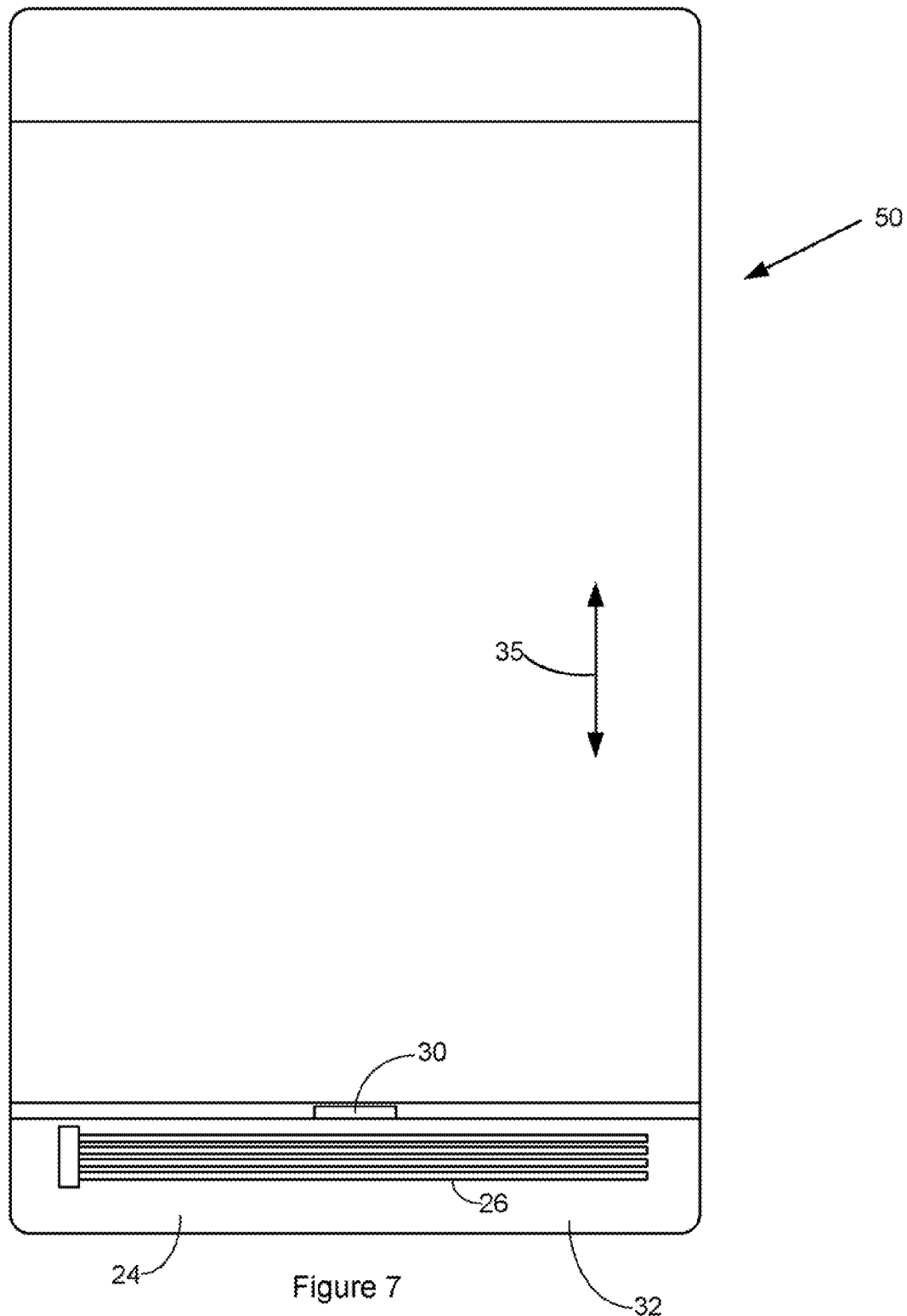
FIG. 7 shows a front cross-sectional view of the holster of FIG. 6.

FIG. 6 shows a side cross-sectional view of another exemplary embodiment of a holster 50 of the present disclosure. FIG. 7 shows a front cross-sectional view of the holster 50 taken along the line VII-VII of FIG. 6. In the holster 50, the piezoelectric elements 26 are contained in a chamber 24 at the bottom region of the holster 50. The charging circuit 32 is also formed at the bottom region of the holster 50. As in the holster 21 described above, the charging circuitry 32 includes a connector 30 that connects to a HED upon the HED being inserted in the holster 50. As in the holster 21, the holster 50 also defines a cavity 33 along the length of which (arrow 35) a HED can be slid in and out. In the holster 50 the piezoelectric members 26 are substantially perpendicular to the length of the holster, the direction of the length being indicated by the arrow As will be understood by the skilled worker, holsters with an open, or partly open, wall are also within the scope of the present disclosure.

As will be understood by the skilled worker, a holster with multiple groups of piezoelectric elements disposed in corresponding multiple compartment is also within the scope of the present disclosure. For example, although not shown, a holster having a first group of piezoelectric elements oriented along the insertion direction of a HED, that is, a direction such as direction 35 at FIGS. 3 and 6, and having a second group of piezoelectric elements oriented perpendicularly to the first group of piezoelectric elements, is within the scope of the present disclosure. The first and second groups of piezoelectric elements could also be disposed in a same compartment without departing from the scope of the present invention.

Figure 8:
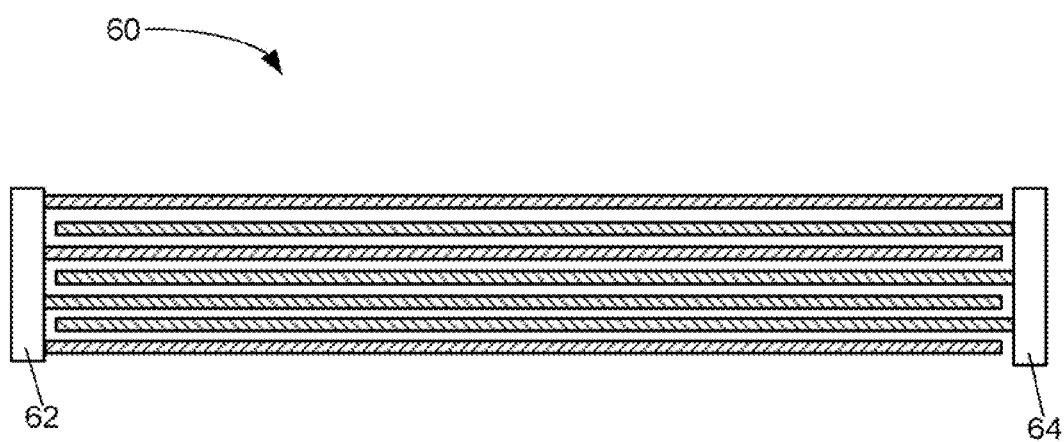
FIG. 8 shows an exemplary arrangement of interleaved piezoelectric elements.

FIG. 8 shows an exemplary embodiment of an arrangement 60 of piezoelectric elements 26 that can be integrated into a holster. The arrangement 60 includes a first comb 62 of piezoelectric elements, and a second comb 64 of piezoelectric elements. The first and second combs 62 and 64 are interleaved and, although not shown, can be electrically connected to any suitable charging circuitry such as charging circuitry 32 described above. As will be understood by the skilled worker, the arrangement 60 can provide enhanced voltage while maintaining relatively small dimensions of the compartment in which they are housed.

Figure 9:
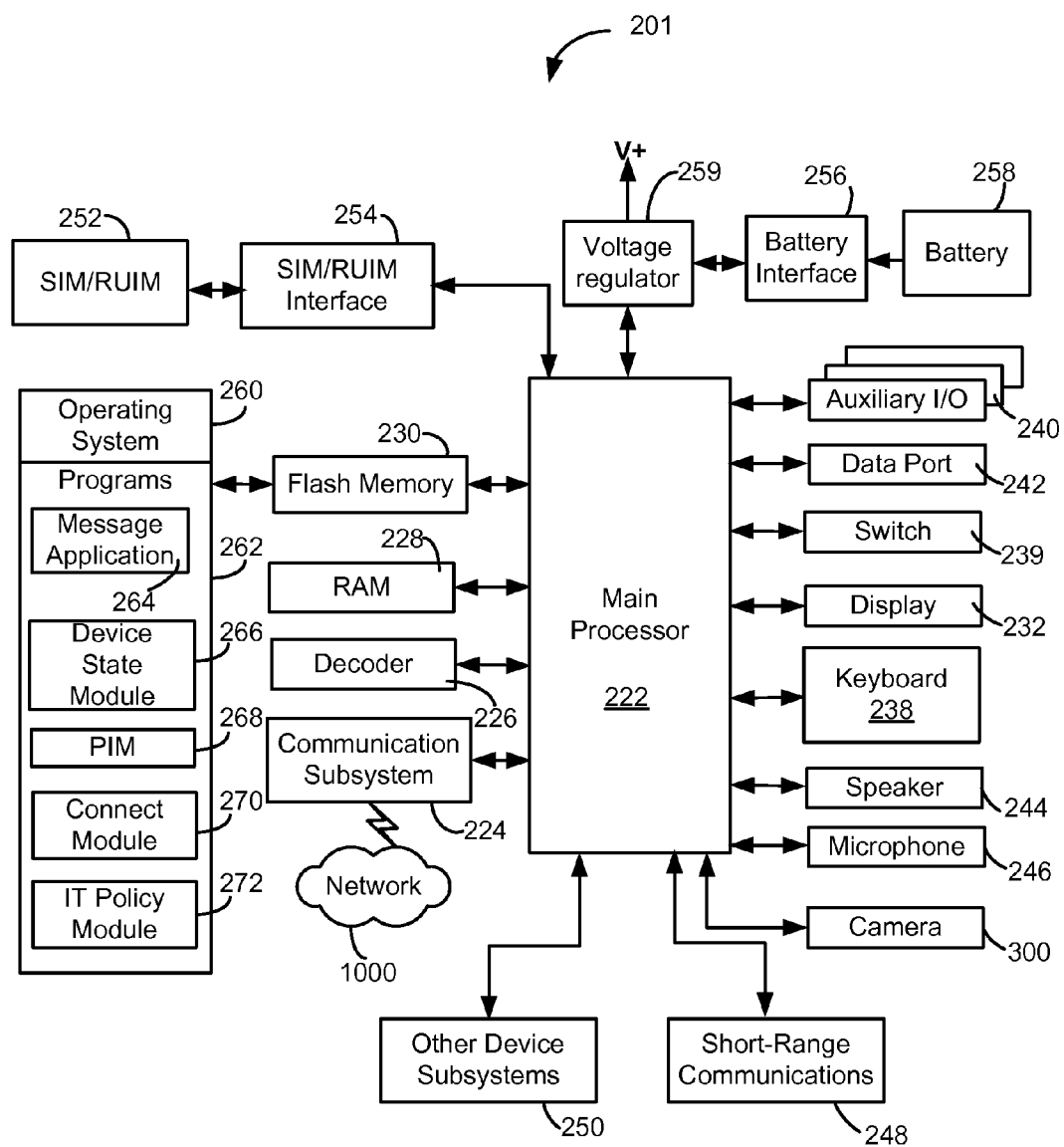
FIG. 9 shows block diagram representation of a handheld electronic device that can be used with the holster of the present disclosure.

Referring FIG. 9, there is shown therein a block diagram of an exemplary embodiment of a HED 201 that can be combined with the holster of the present disclosure, exemplified in embodiment 21 and 50 above.

The HED 201 includes a number of components such as the processor 222 that controls the overall operation of the HED 201. Communication functions, including data and voice communications, are performed through a communication subsystem 224. Data received by the HED 201 can be decompressed and decrypted by a decoder 226, operating according to any suitable decompression techniques (e.g. YK decompression, and other known techniques) and encryption techniques (e.g. using an encryption technique such as Data Encryption Standard (DES), Triple DES, or Advanced Encryption Standard (AES)). The communication subsystem 224 receives messages from and sends messages to a wireless network 1000. In this exemplary embodiment of the HED 201, the communication subsystem 224 is configured in accordance with the Global System for Mobile Communication (GSM) and General Packet Radio Services (GPRS) standards. The GSM/GPRS wireless network is currently used worldwide. New standards such as Enhanced Data GSM Environment (EDGE) and Universal Mobile Telecommunications Service (UMTS) & LTE are believed to have similarities to the network behavior described herein, and it will also be understood by persons skilled in the art that the embodiments described herein are intended to use any other suitable standards that are developed in the future. The wireless link connecting the communication subsystem 224 with the wireless network 1000 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 1000 associated with the HED 201 is a GSM/GPRS wireless network in one exemplary implementation, other wireless networks may also be associated with the HED 201 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA1000 networks, GSM/GPRS networks (as mentioned above), and future third-generation (3G) networks like EDGE and UMTS. Some other examples of data-centric networks include WiFi 802.11, Mobitex™ and DataTAC™ WiMax network communication systems. Examples of other voice-centric data networks include Personal Communication Systems (PCS) networks like GSM and Time Division Multiple Access (TDMA) systems. The processor 222 also interacts with additional subsystems such as a Random Access Memory (RAM) 228, a flash memory 230, a display 232, a keyboard 238, a switch 239, an auxiliary input/output (I/O) subsystem 240, a data port 242, a speaker 244, a microphone 246, short-range communications 248, a camera 300, and other device subsystems 250.

Some of the subsystems of the HED 201 perform communication-related functions, whereas other subsystems may provide "resident" or on-device functions. By way of example, the keyboard 238 may be used for both communication-related functions, such as entering a text message for transmission over the network 1000, and device-resident functions such as a calculator or task list.

The HED 201 can send and receive communication signals over the wireless network 1000 after network registration or activation procedures have been completed. Network access is associated with a subscriber or user of the HED 201. To identify a subscriber according to the present embodiment, the HED 201 uses a SIM/RUIM card 252 (i.e. Subscriber Identity Module or a Removable User Identity Module) inserted into a SIM/RUIM interface 254 for communication with a network such as the network 1000. The SIM/RUIM card 252 is one type of a conventional "smart card" that can be used to identify a subscriber of the HED 201 and to personalize the HED 201, among other things. In the present embodiment the HED 201 is not fully operational for communication with the wireless network 1000 without the SIM/RUIM card 252. By inserting the SIM/RUIM card 252 into the SIM/RUIM interface 254, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. The SIM/RUIM card 252 includes a processor and memory for storing information. Once the SIM/RUIM card 252 is inserted into the SIM/RUIM interface 254, it is coupled to the processor 222. In order to identify the subscriber, the SIM/RUIM card 252 can include some user parameters such as an International Mobile Subscriber Identity (IMSI). An advantage of using the SIM/RUIM card 252 is that a subscriber is not necessarily bound by any single physical mobile electronic device. The SIM/RUIM card 252 may store additional subscriber information for a HED as well, including datebook (or calendar) information and recent call information. Alternatively, user identification information can also be programmed into the flash memory 230. The HED 201 can also be enabled to receive additional memory cards. For example, memory card slots (not shown) can be provided in the HED 201 to receive such cards.

The HED 201 is a battery-powered device and includes a battery interface 256 for receiving a battery pack containing one or more rechargeable battery cells 258, and associated control circuitry (not shown) that, in some embodiments, can interface with the battery interface 256. The battery pack has a form factor and contact arrangement suited to the particular handheld electronic device. In at least some embodiments, the battery 258 can be a smart battery with an embedded microprocessor. The battery interface 256 is coupled to a voltage regulator 259, which assists the battery 258 in providing voltage V+ to the HED 201. Additionally, the voltage regulator 259 connects, through an HED connector formed in at the HED 201, to the connector 30 shown, e.g., at FIG. 3, to receive a voltage from the discharge circuitry 46 of the charging circuitry 32 exemplified at FIG. 5. As described below, the HED connector can be a data port 242. Although current technology makes use of a battery, alternatives to batteries, such as capacitors, or future technologies such as micro fuel cells may provide the power to the HED 201. The concepts described herein are not necessarily limited to any particular kind of battery, or to any particular battery chemistry, or to batteries that use energy storage elements or techniques other than or in addition to chemical energy storage. On the contrary, the concepts described herein may be applicable to a variety of chargeable or rechargeable power packs, including those that are distinct from conventional batteries.

The HED 201 also includes an operating system 260 and software components 262 which are described in more detail below. The operating system 260 and the software components 262 that are executed by the processor 222 are typically stored in a persistent store such as the flash memory 230, which may alternatively be a read-only memory (ROM) or similar storage element (not shown). Those skilled in the art will appreciate that portions of the operating system 260 and the software components 262, such as specific software applications 264, 266, 268, 270 and 272, or parts thereof, may be temporarily loaded into a volatile store such as the RAM 228. Other software components can also be included, as is well known to those skilled in the art.

The subset of software components 262 that control basic device operations, including data and voice communication applications, will normally be installed on the HED 201 during its manufacture. Other software applications include a message application 264 that can be any suitable software program that allows a user of the HED 201 to send and receive electronic messages. Various alternatives exist for the message application 264 as is well known to those skilled in the art. Messages that have been sent or received by the user are typically stored in the flash memory 230 of the HED 201 or some other suitable storage element in the HED 201. In at least some embodiments, some of the sent and received messages may be stored remotely from the HED 201 such as in a data store of an associated host system that the HED 201 communicates with.

The software components 262 can further include a device state module 266, a Personal Information Manager (PIM) 268, and other suitable modules (not shown). The device state module 266 provides persistence, i.e. the device state module 266 ensures that important device data is stored in persistent memory, such as the flash memory 230, so that the data is not lost when the HED 201 is turned off or loses power.

The PIM 268 includes functionality for organizing and managing data items of interest to the user, such as, but not limited to, e-mail, contacts, calendar events, voice mails, appointments, and task items. The PIM 268 has the ability to send and receive data items via the wireless network 1000. PIM data items may be seamlessly integrated, synchronized, and updated via the wireless network 1000 with the HED subscriber's corresponding data items stored or associated, or both, with a host computer system. This functionality creates a mirrored host computer on the HED 201 with respect to such items. This can be particularly advantageous when the host computer system is the HED subscriber's office computer system.

The software components 262 also include a connect module 270, and an information technology (IT) policy module 272. The connect module 270 implements the communication protocols that are required for the HED 201 to communicate with the wireless infrastructure and any host system, such as an enterprise system, that the HED 201 is authorized to interface with.

The connect module 270 includes a set of APIs that can be integrated with the HED 201 to allow the HED 201 to use any number of services associated with the enterprise system. The connect module 270 allows the HED 201 to establish an end-to-end secure, authenticated communication pipe with the host system. A subset of applications for which access is provided by the connect module 270 can be used to pass IT policy commands from the host system to the HED 201. This can be done in a wireless or wired manner. These instructions can then be passed to the IT policy module 272 to modify the configuration of the HED 201. Alternatively, in some cases, the IT policy update can also be done over a wired connection.

Other types of software applications can be installed on the HED 201. These software applications can be third party applications, which are added after the manufacture of the HED 201. Examples of third party applications include games, calculators, utilities, etc.

The additional applications can be loaded onto the HED 201 through at least one of the wireless network 1000, the auxiliary I/O subsystem 240, the data port 242, the short-range communications subsystem 248, or any other suitable device subsystem 250. This flexibility in application installation increases the functionality of the HED 201 and may provide enhanced on-device functions, communication-related functions, or both. For example, secure communication applications may enable electronic commerce functions and other such financial transactions to be performed using the HED 201.

The data port 242 enables a subscriber to set preferences through an external device or software application and extends the capabilities of the HED 201 by providing for information or software downloads to the HED 201 other than through a wireless communication network. The alternate download path may, for example, be used to load an encryption key onto the HED 201 through a direct and thus reliable and trusted connection to provide secure device communication.

The data port 242 can be any suitable port that enables data communication between the HED 201 and another computing device. The data port 242 can be a serial or a parallel port. In some instances, the data port 242 can be a USB port that includes data lines for data transfer and a supply line that can provide a charging current to charge the battery 258 of the HED 201.

The short-range communications subsystem 248 provides for communication between the HED 201 and different systems or devices, without the use of the wireless network 1000. For example, the short-range communications subsystem 248 may include an infrared device and associated circuits and components for short-range communication. Examples of short-range communication standards include standards developed by the Infrared Data Association (IrDA), Bluetooth, and the 802.11 family of standards developed by IEEE.

Synchronization of files and data between the HED 201 and another computing device can be achieved over the wireless network 1000, through the short-range communications system 248, or through a direct connection between the data port 242 of the HED 201 and the other computing device. Synchronization causes the most recent version of files and data to be mirrored on either the HED or the other computing device. As used herein, synchronization also refers to the downloading or uploading of pre-selected files from one device to the other. Synchronization of files and data can be initiated by the user of the device whenever a suitable connection between the HED 201 and another computing device, such as a home computer, is detected, or can occur automatically when a connection is detected. A synchronization application, stored in the HED 201 or the other computing device, or both, can determine the file and data types to be synchronized, the frequency of synchronization, and other parameters, appropriate to the particular synchronization algorithm implemented by the synchronization application.

In use, a received signal such as a text message, an e-mail message, or web page download is processed by the communication subsystem 224 and input to the processor 222. The processor 222 then processes the received signal for output to the display 232 or alternatively to the auxiliary I/O subsystem 240. A subscriber may also compose data items, such as e-mail messages, for example, using the keyboard 238, and, possibly, the auxiliary I/O subsystem 240. The auxiliary I/O subsystem 240 may include devices such as: a mouse, track ball, infrared fingerprint detector, or a roller wheel with dynamic button pressing capability. A composed item may be transmitted over the wireless network 1000 through the communication subsystem 224.

For voice communications, the overall operation of the HED 201 is substantially similar, except that the received signals are output to the speaker 244, and signals for transmission are generated by the microphone 246. Alternative voice or audio I/O subsystems, such as a voice message recording subsystem, can also be implemented on the HED 201. Although voice or audio signal output is accomplished primarily through the speaker 244, the display 232 can also be used to provide additional information such as the identity of a calling party, duration of a voice call, or other voice call related information.

In the preceding description, for purposes of explanation, numerous details are set forth in order to provide a thorough understanding of the embodiments of the disclosure. However, it will be apparent to one skilled in the art that these specific details are not required in order to practice the disclosure. In other instances, well-known electrical structures and circuits are shown in block diagram form in order not to obscure the disclosure. For example, specific details are not provided as to whether the embodiments of the disclosure described herein are implemented as a software routine, hardware circuit, firmware, or a combination thereof.

The concepts described above may realize one or more advantages. Recharging of a battery in an HED can be very convenient for a user, as the recharging can take place automatically when the user inserts the HED into the holster. The user need not even be aware that recharging is occurring. Further, because the holster may be secured to the user (such as at the user's pocket or belt), the holster may be in motion as the user is in motion, and the piezoelectric elements may generate energy, which can be stored for recharging, even if the HED itself is stationary. The holster can harvest energy whether the HED is inserted in the holster or not. Some embodiments described above do not significantly add to the dimensions, bulk or weight of the HED. To the extent that there is any addition to the dimensions, bulk or weight of the holster, this addition is less likely to be noticed by or be an inconvenience to the user. A further potential benefit is that the holster can perform at least two functions at the same time: retaining the HED for access by the user, and coupling the piezoelectric charging circuitry to the HED when the HED is not in use. In some embodiments, inductive electrical coupling between the HED and the holster may enhance the convenience to the user by omitting a need for a wired electrical coupling between the HED and the holster.

The above-described embodiments of the disclosure are intended to be examples only. Alterations, modifications and variations can be effected to the particular embodiments by those of skill in the art without departing from the scope of the disclosure, which is defined solely by the claims appended hereto.

What is claimed is:

1. A holster for a handheld electronic device, the holster comprising:
   at least one piezoelectric element to generate an input voltage upon being deformed;
   a chamber for housing the at least one piezoelectric element, each of the at least one piezoelectric element having a first portion fixedly secured to the chamber and a second portion movable with respect to the first portion; and charging circuitry electrically connected to the at least one piezoelectric element, the charging circuitry having an electrical connector, the charging circuitry to provide an output voltage to the electrical connector in accordance with the input voltage and in accordance with pre-determined charging circuit parameters, the electrical connector to connect to the handheld electronic device upon the handheld electronic device being inserted into the holster.

2. The holster of claim 1 wherein each piezoelectric is an elongated member.

3. The holster of claim 2 wherein the holster defines a cavity having a cavity length along which the handheld electronic device can be slid in and out of the holster.

4. The holster of claim 3 wherein each elongated member is substantially parallel to the cavity length.

5. The holster of claim 3 wherein each elongated member is substantially perpendicular to the cavity length.

6. The holster of claim 1 wherein the holster defines a housing for receiving the handheld electronic device, the holster further comprising a fastening element secured to the housing, the fastening element being rotatable with respect to the housing to change an orientation of the housing with respect to the fastening element.

7. The holster of claim 6 wherein the fastening element includes a clip.

8. The holster as in claim 1 in combination with the handheld electronic device.

* * * * *